(12) United States Patent
Kamgaing

(10) Patent No.: US 12,205,908 B2
(45) Date of Patent: Jan. 21, 2025

(54) DIE TO DIE HIGH-SPEED COMMUNICATION WITHOUT DISCRETE AMPLIFIERS BETWEEN A MIXER AND TRANSMISSION LINE

(71) Applicant: Intel Corporation, Santa Clara, CA (US)

(72) Inventor: Telesphor Kamgaing, Chandler, AZ (US)

(73) Assignee: Intel Corporation, Santa Clara, CA (US)

( * ) Notice: Subject to any disclaimer, the term of this patent is extended or adjusted under 35 U.S.C. 154(b) by 708 days.

(21) Appl. No.: 17/349,777

(22) Filed: Jun. 16, 2021

(65) Prior Publication Data

US 2022/0406737 A1 Dec. 22, 2022

(51) Int. Cl.
*H01L 23/66* (2006.01)
*H01L 23/00* (2006.01)
*H01L 23/498* (2006.01)
*H01L 23/538* (2006.01)
*H01L 25/065* (2023.01)

(52) U.S. Cl.
CPC ........ *H01L 23/66* (2013.01); *H01L 23/49816* (2013.01); *H01L 23/49822* (2013.01); *H01L 23/49838* (2013.01); *H01L 23/5381* (2013.01); *H01L 23/5383* (2013.01); *H01L 23/5386* (2013.01); *H01L 24/16* (2013.01); *H01L 25/0652* (2013.01); *H01L 2223/6616* (2013.01); *H01L 2223/6627* (2013.01); *H01L 2223/6644* (2013.01); *H01L 2223/6688* (2013.01); *H01L 2224/16146* (2013.01); *H01L 2224/16225* (2013.01); *H01L 2225/06513* (2013.01); *H01L 2225/06517* (2013.01); *H01L 2225/06541* (2013.01); *H01L 2225/06548* (2013.01); *H01L 2924/14215* (2013.01); *H01L 2924/14222* (2013.01)

(58) Field of Classification Search
CPC .............................. H01L 23/00; H10L 25/065
See application file for complete search history.

(56) References Cited

FOREIGN PATENT DOCUMENTS

| EP | 2333828 | 6/2011 |
|---|---|---|
| EP | 3712939 | 9/2020 |
| WO | WO-2017052566 | 3/2017 |

OTHER PUBLICATIONS

Extended European Search Report for European Patent Application No. 22170452.1 mailed Oct. 25, 2022, 9 pgs.

*Primary Examiner* — Marvin Payen
(74) *Attorney, Agent, or Firm* — Schwabe, Williamson & Wyatt, P.C.

(57) ABSTRACT

Embodiments described herein may be related to apparatuses, processes, and techniques related to a transceiver architecture for inter-die communication on-package using mm-wave/THz interconnects. In particular, amplifier-less transceivers are used in combination with on-package low loss transmission lines to provide inter-die communication. In embodiments, signals on the interconnect may be transmitted between up conversion mixers and down conversion mixers without any additional amplification. Other embodiments may be described and/or claimed.

20 Claims, 9 Drawing Sheets

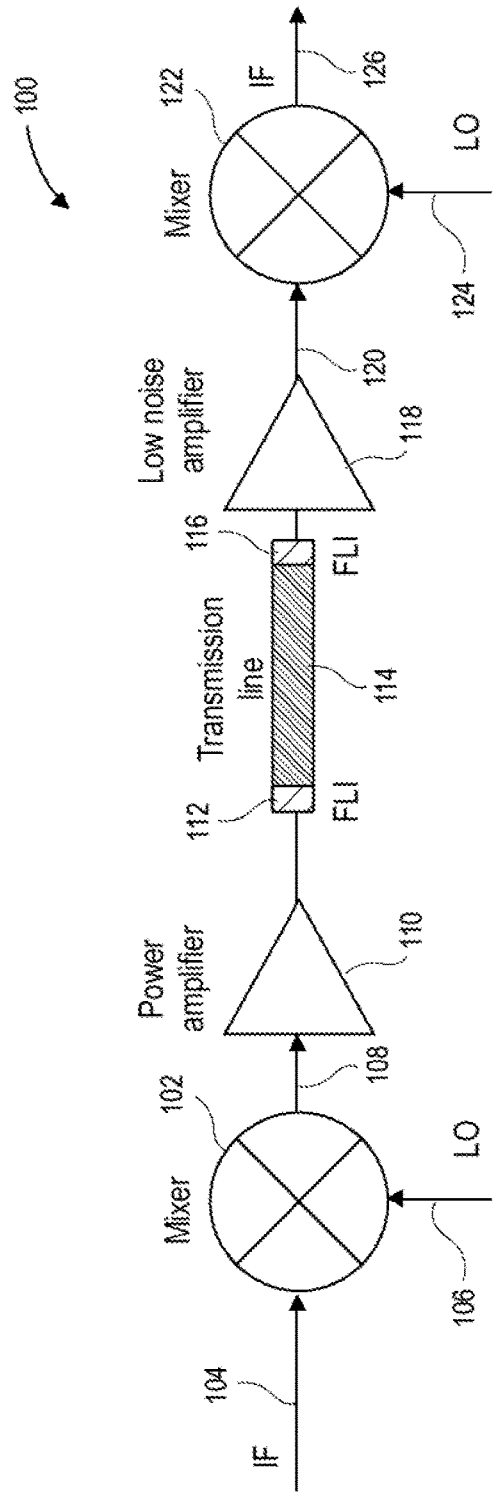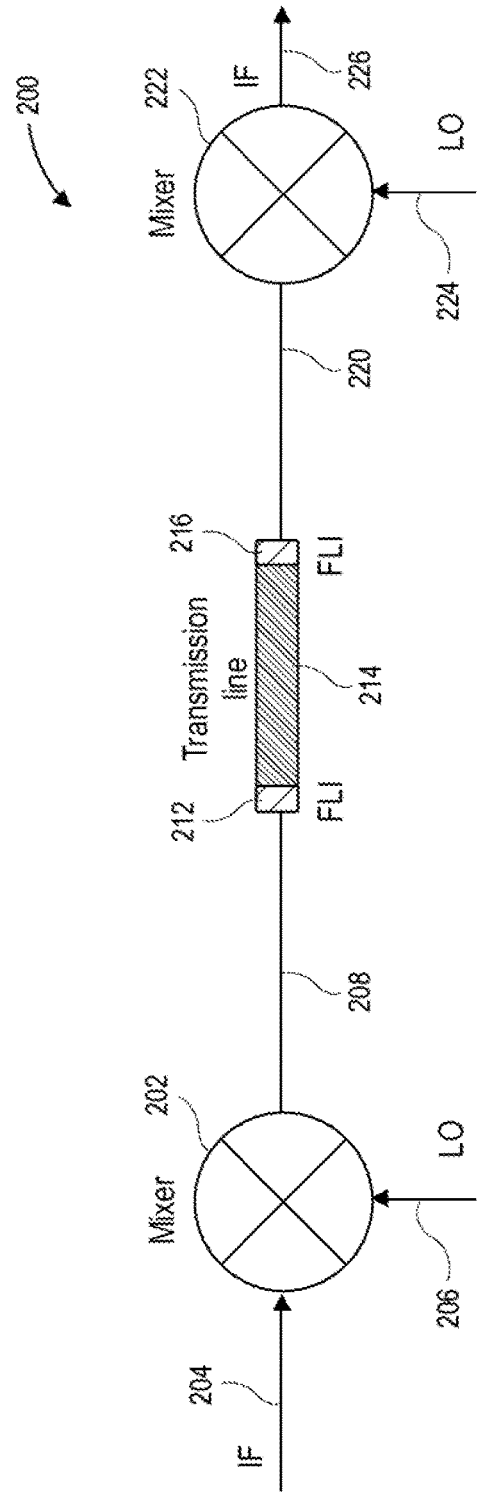

DIE TO DIE HIGH-SPEED COMMUNICATION WITHOUT DISCRETE AMPLIFIERS BETWEEN A MIXER AND TRANSMISSION LINE

FIELD

Embodiments of the present disclosure generally relate to the field of semiconductor packaging, and in particular to communication between dies of a package.

BACKGROUND

Continued growth in computing and mobile devices will continue to increase the demand for increased bandwidth density between dies within semiconductor packages.

BRIEF DESCRIPTION OF THE DRAWINGS

FIG. 1 illustrates a schematic block diagram of a legacy full interconnect for long-range signal transmission.

FIG. 2 illustrates a millimeter-wave (mm-wave)/Tera-Hertz (THz) on package interconnect for short range package connectivity, in accordance with various embodiments.

DETAILED DESCRIPTION

Figure 3:
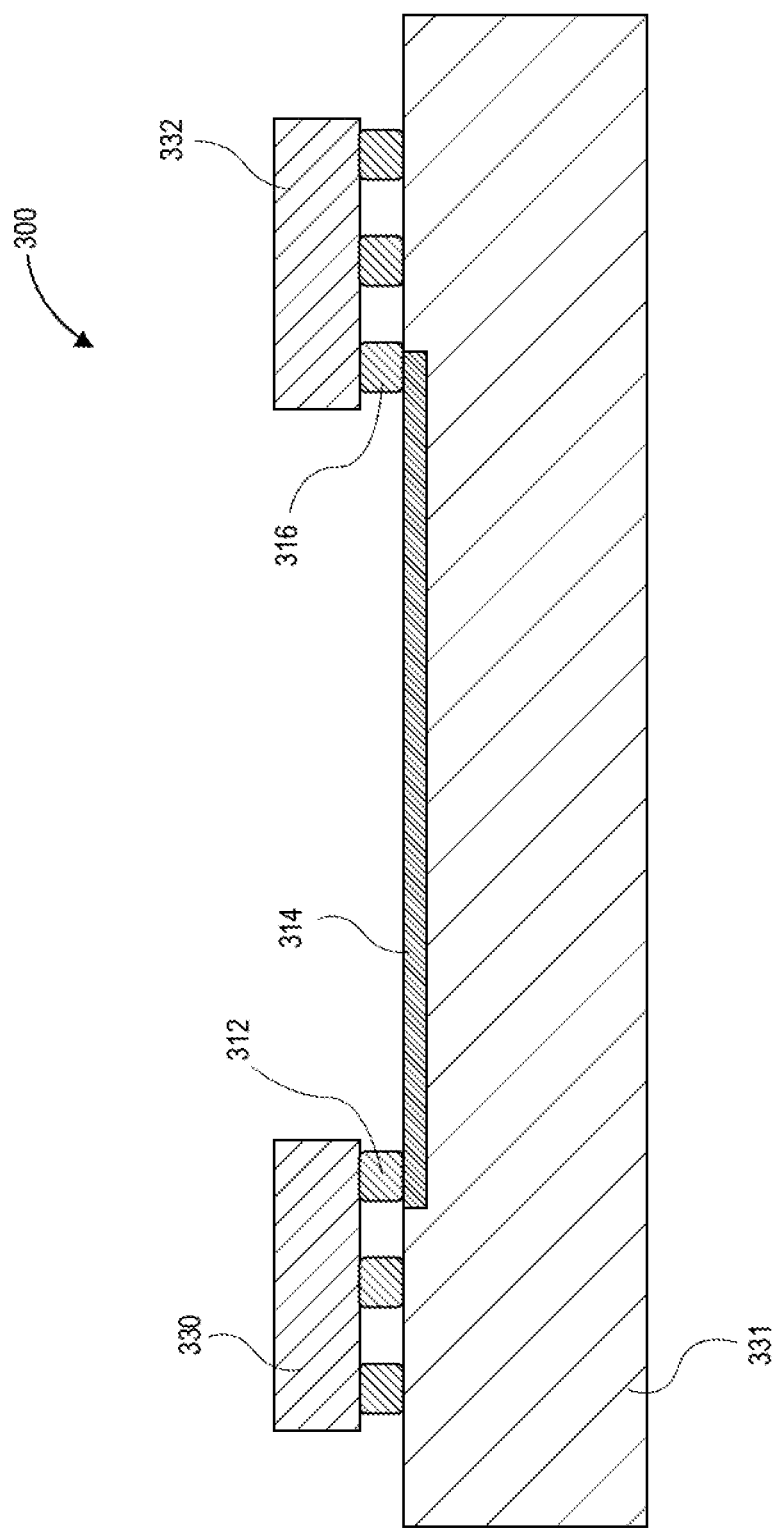
FIG. 3 illustrates a schematic block diagram of a mm-wave/THz interconnect architecture with omitted amplifiers, in accordance with various embodiments.

Embodiments described herein may be related to apparatuses, processes, and techniques related to a transceiver architecture to reduce the die area and/or footprint and power consumption of on-package based mm-wave/THz interconnects. Embodiments include amplifier-less transceivers in combination with on-package low loss transmission lines, which may include copper traces or strip lines. In embodiments, signals on the interconnect may be transmitted between up conversion mixers and down conversion mixers without any additional amplification required.

Embodiments may reduce power consumption yielding better channel efficiency, and reduce circuit sizes that yield increased bandwidth efficiency. In addition, embodiments may be easier to integrate on CMOS than legacy implementations, resulting in a lower overall manufacturing cost. Also, high-speed links enabled by embodiments herein may reduce the number of bumps required per die, enabling assembly of the large pitches without being bump limited. This may result in better reliability and yield. In addition, die disaggregation may also be facilitated by embodiments described herein.

Die disaggregation provides the ability to combine technologies from different nodes and processes to improve overall system performance. For example, a die complex that combines digital circuitries based on 7 nm technology and analog circuits based on 14 nm may be formed at the package level rather than using an SoC die, where the area-consuming analog circuits are implemented on a more expensive process. In a die complex, the packaging is the main medium used to connect the analog and digital die and enable communication between them.

XPUs may use die disaggregation and restitching to achieve yield and performance targets. With the increase demand in data rates, high bandwidth density is required between various high-speed dies on the platform. The high bandwidth density can be achieved by using multiple data lanes that operate at very low speeds, for example <5 gigabits per second (Gbps) per lane, or by using fewer high-speed lanes. Challenges with the speed lanes are typically associated with the overall power consumption. For example, serialization/deserialization circuits and associated drivers may be needed for baseband signaling. For mm-wave and THz signaling, RF transceivers are required as part of the high-speed signal link. On those circuitries contribute to the overall power consumption of the links.

Legacy implementations of high-speed connectivity between co-packaged dies are achieved by using either passive or active connections. Legacy passive interconnects include embedded multi-die interconnect bridges (EMIB) or omni-directional interconnects (ODI). Active connections can be made using optical, electrical SerDes or millimeter wave technologies. Passive solutions such as EMIB and ODI are limited in reach due to insertion loss and crosstalk. Active solutions such as optical interconnects may not be efficient for short range connectivity, due to direct current (DC) power overhead needed to convert between electrical and optical signals. Mm-wave legacy solutions are copied from wireless communication, where past losses are usually high, therefore leading to an unnecessary increase in power consumption due to amplifiers inserted at the end of the transmitter and at the beginning of the receiver.

In the following detailed description, reference is made to the accompanying drawings which form a part hereof, wherein like numerals designate like parts throughout, and in which is shown by way of illustration embodiments in which the subject matter of the present disclosure may be practiced. It is to be understood that other embodiments may be utilized and structural or logical changes may be made without departing from the scope of the present disclosure. Therefore, the following detailed description is not to be taken in a limiting sense, and the scope of embodiments is defined by the appended claims and their equivalents.

For the purposes of the present disclosure, the phrase "A and/or B" means (A), (B), or (A and B). For the purposes of the present disclosure, the phrase "A, B, and/or C" means (A), (B), (C), (A and B), (A and C), (B and C), or (A, B and C).

The description may use perspective-based descriptions such as top/bottom, in/out, over/under, and the like. Such descriptions are merely used to facilitate the discussion and are not intended to restrict the application of embodiments described herein to any particular orientation.

The description may use the phrases "in an embodiment," or "in embodiments," which may each refer to one or more of the same or different embodiments. Furthermore, the terms "comprising," "including," "having," and the like, as used with respect to embodiments of the present disclosure, are synonymous.

The term "coupled with," along with its derivatives, may be used herein. "Coupled" may mean one or more of the following. "Coupled" may mean that two or more elements are in direct physical or electrical contact. However, "coupled" may also mean that two or more elements indirectly contact each other, but yet still cooperate or interact with each other, and may mean that one or more other elements are coupled or connected between the elements that are said to be coupled with each other. The term "directly coupled" may mean that two or more elements are in direct contact.

Various operations may be described as multiple discrete operations in turn, in a manner that is most helpful in understanding the claimed subject matter. However, the order of description should not be construed as to imply that these operations are necessarily order dependent.

As used herein, the term "module" may refer to, be part of, or include an ASIC, an electronic circuit, a processor (shared, dedicated, or group) and/or memory (shared, dedicated, or group) that execute one or more software or firmware programs, a combinational logic circuit, and/or other suitable components that provide the described functionality.

Various Figures herein may depict one or more layers of one or more package assemblies. The layers depicted herein are depicted as examples of relative positions of the layers of the different package assemblies. The layers are depicted for the purposes of explanation, and are not drawn to scale. Therefore, comparative sizes of layers should not be assumed from the Figures, and sizes, thicknesses, or dimensions may be assumed for some embodiments only where specifically indicated or discussed.

FIG. 1 illustrates a schematic block diagram of a legacy full interconnect for long-range signal transmission over a transmission line or a waveguide. Legacy channel 100 includes a first mixer 102 that receives a first input 104, that may include an intermediary frequency (IF) signal coming from a baseband circuits. The first mixer 102 also receives a second input 106, which may be a local oscillator (LO) signal. The first mixer 102 then generates a high-speed (HS) signal transmitted on output 108 that is based on a mixing of the IF signal and LO signals. The HS signal on the output 108 then goes through a power amplifier 110 before entering a transmission channel (e.g. transmission line 114). In implementations, the transmission line 114 may be a copper routing layer, a strip line, a microstrip, a co-planar waveguide, a grounded coplanar waveguide, or other conductive material. In implementations, the transmission line 114 may have one first level interconnect 112 at one end of the transmission line 114 and another first level interconnect 116 at the other end of the transmission line 114. In implementations, the transmission line 114 may be an on-package waveguide channel. The signal may then go through another amplifier 118, which may be a low noise amplifier, before the HS signal enters a first input 120 of the second mixer 122. A LO signal is received on a second input 124 of the second mixer 122. An IF signal 126 is then output by the second mixer 122, based upon a combination of the HS signal and the LO signal. In embodiments, the first mixing may be referred to as up conversion from an IF signal to an HS signal, and the second mixing may be referred to as a down conversion from the HS signal to the IF signal.

FIG. 2 illustrates a schematic block diagram of a mm-wave/THz interconnect architecture with omitted amplifiers, in accordance with various embodiments. Channel 200 includes a first mixer 202, which may be similar to first mixer 102 of FIG. 1, that receives a first input 204, that may include an intermediary frequency (IF) signal coming from a baseband device. The first mixer 202 also receives a second input 206, which may be a LO signal. The first mixer 202 then generates a HS signal on an output 208 that is based on a combination of the IF signal and LO signals. The HS signal output 208 then enters a transmission line 214. In implementations, the transmission line 214 may be a copper routing layer, a strip line, or other conductive material. In implementations, the transmission line 214 may have one first level interconnect 212 at one end of the transmission line 214 and another first level interconnect 216 at the other end of the transmission line 214. In embodiments, the transmission line 214 may be an on-package waveguide channel as discussed further below with respect to FIG. 3. The HS signal may then enter a first input 220 of the second mixer 222. A LO signal is received on a second input 224 of the second mixer 222. An IF signal 226 is then output by the second mixer 222, based upon a combination of the HS signal and the LO signal. Note that the embodiment of FIG. 2 does not involve any power amplifiers. In embodiments, the transmission line 214 carries a radio frequency (RF) signal.

FIG. 3 illustrates a millimeterwave (mm-wave)/terahertz (THz) on package interconnect for short range package connectivity, in accordance with various embodiments. Package 300 may be used to implement channel 200 of FIG. 2. Package 300 may include a transmission line 314 that is electrically coupled with transmitter (Tx) die 330 that includes radiofrequency (RF) circuitry and a receiver (Rx) die 332 that includes RF circuitry. The transmission line 314 may be similar to transmission line 214 of FIG. 2. The Tx die 330 may be coupled with the transmission line 314 through a first level interconnect 312, which may be similar to first level interconnect 212 of FIG. 2. In embodiments, the Tx die 330 may include a mixer similar to mixer 202 of FIG. 2 that receives an IF and LO signal, similar to IF signal 204 and LO signal 206 of FIG. 2, to produce a HS signal to be transmitted on transmission line 314.

The Rx die 332 may be coupled with the transmission line 314 through a first level interconnect 316, which may be similar to first level interconnect 216 of FIG. 2. In embodiments, the Rx die 332 may include a mixer similar to mixer 222 of FIG. 2, that receives a HS signal from the transmission line 314 and LO signal similar to HS signal 220 and LO signal 224 of FIG. 2, to produce an IF signal. In embodiments, the transmission line 314 may be a metal-based waveguide channel. In embodiments, the first level interconnects 312, 316 may be flip-chip bumps or bond wires. Note that in legacy implementations, the Tx die 330 and the Rx die 332 may include amplifiers similar to legacy amplifiers 110, 118 of FIG. 1.

Package 300 may have a typical link budget that includes expected channel losses and required power levels at the Tx die 330 and the Rx die 332 for the link to be functional. As shown, the power out for the Tx die 330 may be −14 dBm, and the power in for the Rx die 332 may be −25 dBm. The overall dB loss from the Tx die 330 to the Rx die 332 may be 3 dB from the first level interconnect 312, 5 dB from the transmission line 314, and another 3 dB from the first level interconnect 316. In this example, the total loss is 11 dB. This loss is significantly lower than the losses that would occur if the transmission line 314 was a free space channel, for example an over the air transmission, or a long reach channel. As a result, one or both of the legacy amplifiers 110, 118 of FIG. 1 may be omitted without negatively impacting signal transmission.

Figure 4:
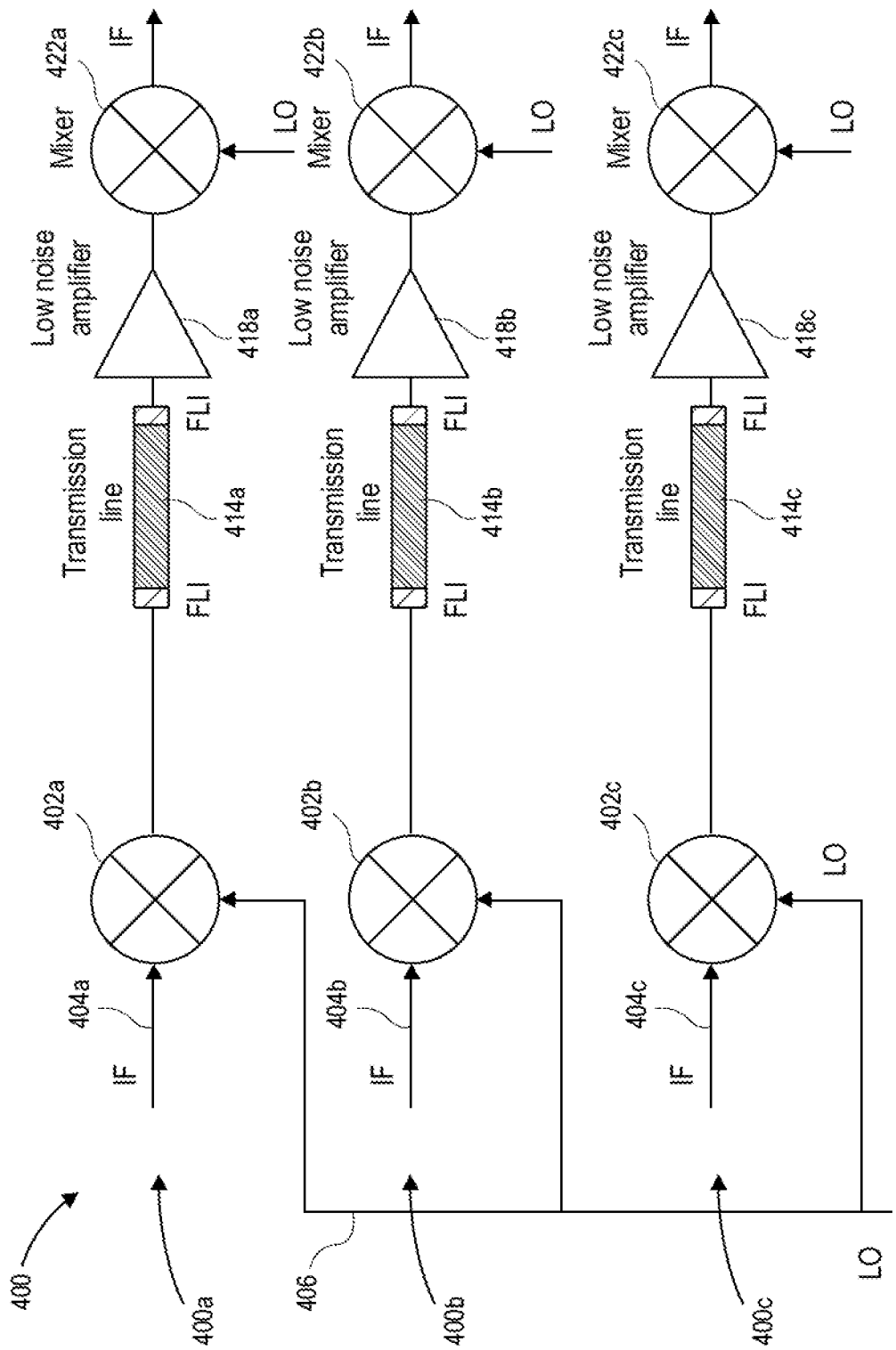
FIG. 4 illustrates a schematic block diagram of multiple medium reach interconnects sharing a local oscillator (LO), in accordance with various embodiments.

FIG. 4 illustrates a schematic block diagram of multiple medium reach interconnects sharing a local oscillator (LO), in accordance with various embodiments. Schematic block diagram 400, which may be similar to schematic block diagram of FIG. 2, shows three medium reach interconnect channels 400a, 400b, and 400c. In embodiments, the losses between the first mixers 402a, 402b, 402c, and the second mixers 422a, 422b, 422c respectively may require only amplifiers 418a, 418b, 418c. These may be low noise amplifiers (LNA), added respectively after the transmission lines 414a, 414b, 414c, and before the second mixers 422a, 422b, 422c. In embodiments, this position for the amplifiers 418a, 418b, 418c may be preferred because a LNA may be combined with filters (not shown) for noise and harmonics filtering.

It should also be noted that a single LO signal 406, which may be similar to LO signal 206 of FIG. 2, may be provided as an input to each of the first mixers 402a, 402b, 402c and/or each of the second mixers 422a, 422b, 422c. Sharing the LO signals 406 between multiple channels 400a, 400b, 400c will reduce overall power consumption and real estate associated with LO signal generation.

Note that in other embodiments (not shown), instead of amplifiers 418a, 418b, 418c located between transmission lines 414a, 414b, 414c and second mixers 422a, 422b, 422c respectively, amplifiers instead may be located between the first mixers 402a, 402b, 402c and the transmission lines 414a, 414b, 414c, with no amplifiers between the transmission lines 414a, 414b, 414c and second mixers 422a, 422b, 422c, respectively. In still other embodiments (not shown) one or more of the channels 400a, 400b, 400c may have different configurations of where amplifiers are placed, or whether amplifiers are included at all.

Figure 5:
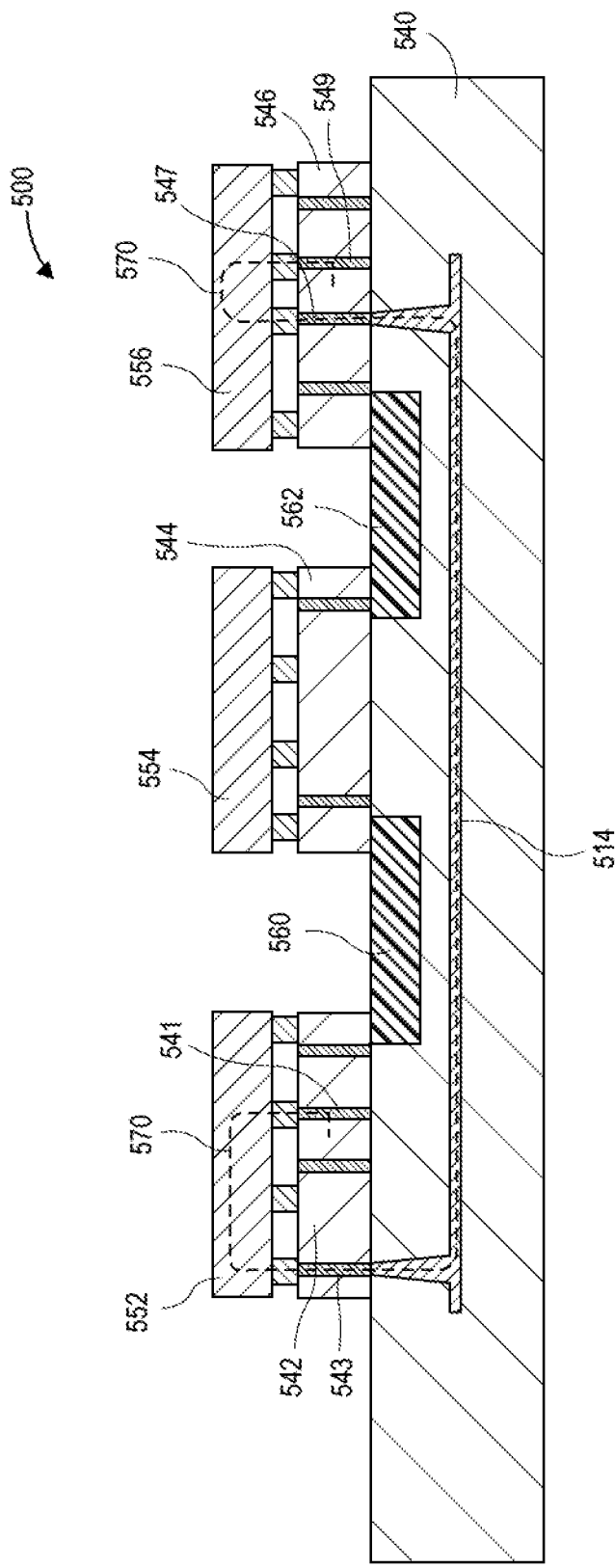
FIG. 5 illustrates a stacked die architecture with a transmission line embedded within a package substrate, in accordance with various embodiments.

FIG. 5 illustrates a stacked die architecture with a transmission line embedded within a package substrate, in accordance with various embodiments. Platform 500 includes a substrate 540, with a first die 542, a second die 544, and a third die 546 attached to a side of the substrate 540. A first RF chip 552 is attached to the first die 542, a second RF chip 554 is attached to the second die 544, and a third RF chip 556 is attached to the third die 546.

The first die 542 and the second die 544 may be connected by a high-speed bridge 560. The second die 544 and the third die 546 may also be connected by a high-speed bridge 562. The high-speed bridges 560, 562 may include an EMIB, an ODI, a high-density on package interconnect, or a zero misalignment via (ZMV), or some other high-speed bridge. The first die 542, however, may not be able to use high-speed bridges to communicate with the third die 546 due to the physical distance between the first die 542 and the third die 546.

In embodiments, the first die 542 may communicate with the third die 546 using the communication path 570. Data to be communicated may be identified within the first die 542, which may then transmit the data within an IF signal to the first RF chip 552. The first RF chip 552 may include one or more first mixers, such as first mixers 402a, 402b, 402c of FIG. 4, to receive the IF signal from the first to die 542 and combine the IF signal with a LO signal (not shown) to produce an HS signal that is transmitted through the communication path 570 through one or more vias 543 within the first die 542, to one or more transmission lines 514, which may be similar to transmission lines 414a, 414b, 414c of FIG. 4.

The communication path 570, may then route from the one or more transmission lines 514 through one or more vias 547 within the third die 546 to the third RF chip 556. The third RF chip 556 includes one or more second mixers, to take the HS signal from the one or more transmission lines 514, combine it with a LO signal such as LO signal 406 of FIG. 4, to produce an IF signal that is then transmitted through via 549 back to the third die 546 for processing. Note that the communication path 570 from the first RF chip 552 to the third RF chip 556 did not use any amplifiers either before or after the one or more transmission lines 514.

Figure 6:
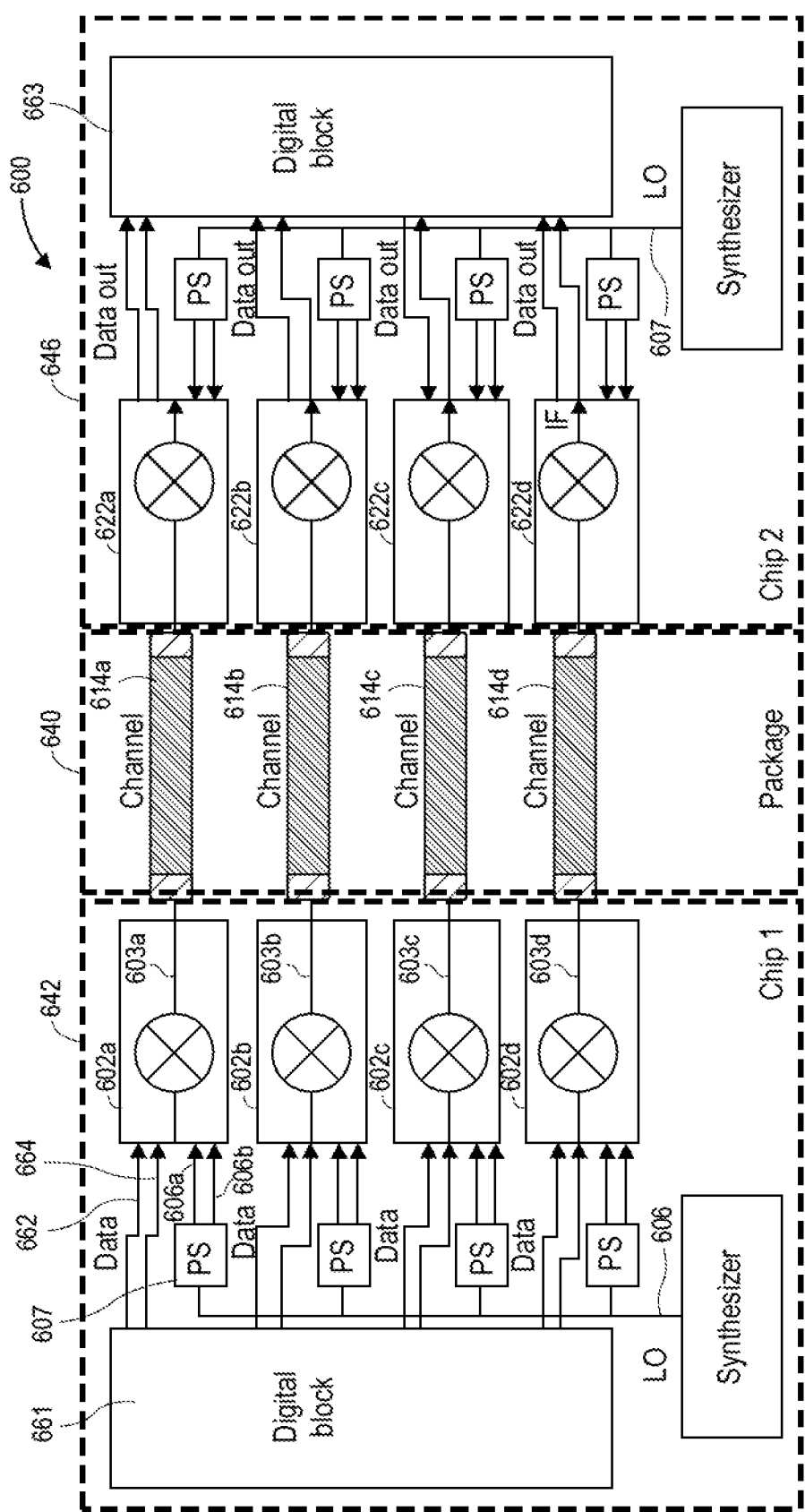
FIG. 6 illustrates a schematic block diagram of a platform that includes multiple dies that are connected using multiple interconnects, in accordance with various embodiments.

FIG. 6 illustrates a schematic block diagram of a platform that includes multiple dies that are connected using multiple interconnects, in accordance with various embodiments. Schematic block diagram 600 shows a first die 642 and a second die 646 that are communicatively coupled by a package 640. The first die 642 may include a first digital block 661, which may be similar to first die 542 of FIG. 5, and includes four first mixers 602a, 602b, 602c, 602d that may be similar to mixers 402a, 402b, 402c of FIG. 4. In embodiments, the four first mixers may be included in a separate die, which may be similar to the first RF chip 552 of FIG. 5. As shown, two separate IF data lines from the first digital block, for example a first IF data line 662, and a second IF data line 664, may be sent to a first mixer 602a. An LO signal 606 may go through a phase shifter, for example phase shifter 607, to produce a first LO signal 606a and a second LO signal 606b at a different phase than LO signal 606a. The first LO signal 606a may be combined with the first IF data line 662, and the second LO signal 606b may be combined with the second IF data line 664 to create an HS signal 603a that includes all the data from the IF data lines 662,664.

The package 640 has a plurality of transmission channels 614a, 614b, 614c, 614d that transmit the HS signals 603a, 603b, 603c, 603d, respectively, to four second mixers 622a, 622b, 622c, 622d on package 646. The second mixers use a phase shifted LO signal 607, in a process similar to LO signal 606 described above, to convert the respective HS signals into an IF signal on two different data lines for each of the four second mixers 622a, 622b, 622c, 622d, to a second digital block 663. Thus, in embodiments, many high-speed data lanes on a package may be run to substantially increase the data rate between dies. For example, if each lane transmission can transmit 200 Gb per second, then 1 Tb per second may be aggregated over five lanes.

Figure 7:
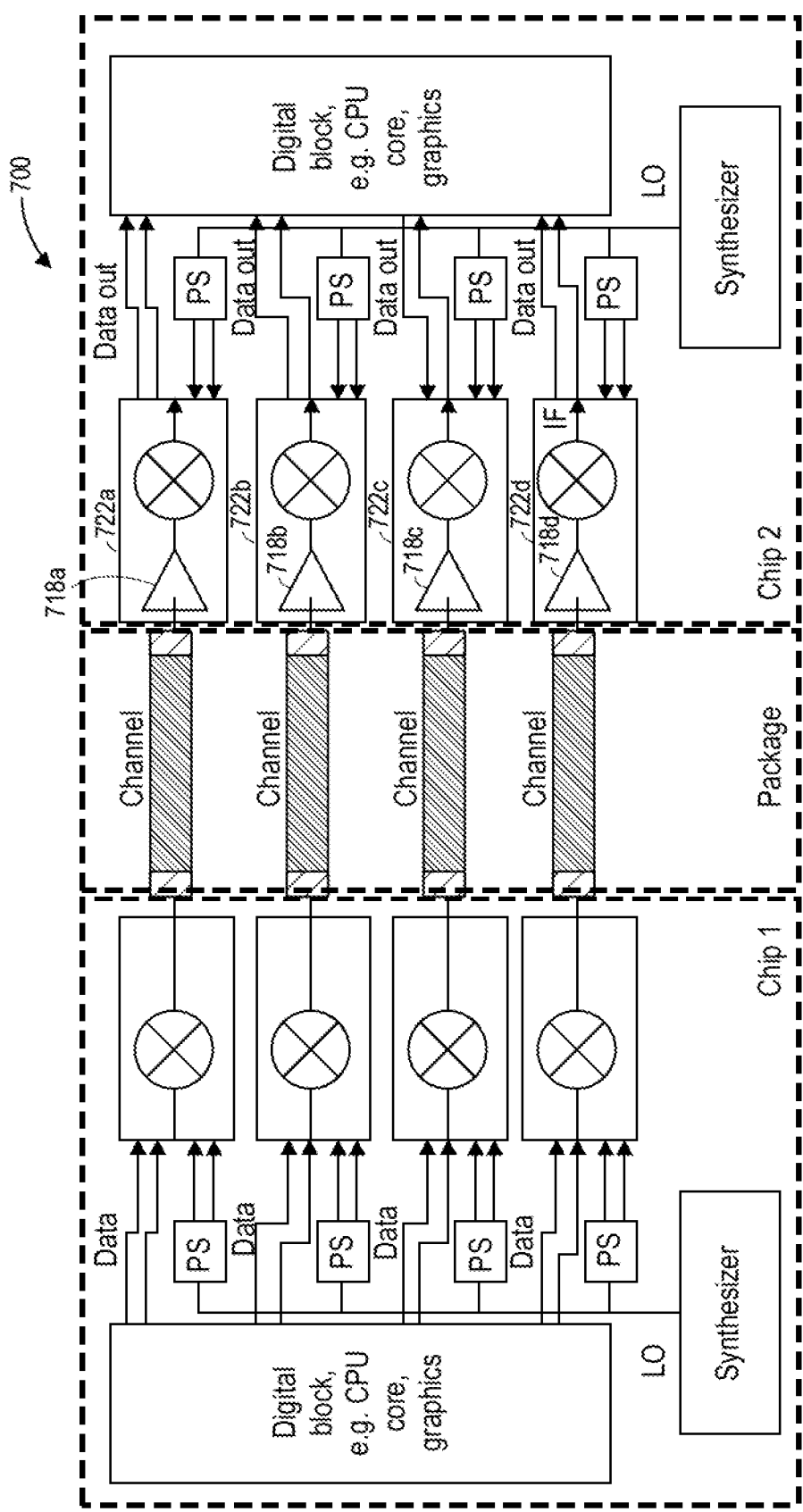
FIG. 7 illustrates a schematic block diagram of a platform that includes multiple dies that are connected using multiple interconnects that have single-sided amplification, in accordance with various embodiments.

FIG. 7 illustrates a schematic block diagram of a platform that includes multiple dies that are connected using multiple interconnects that have single-sided amplification, in accordance with various embodiments. Schematic block diagram 700 may be similar to schematic block diagram 600 of FIG. 6, with the exception that the four second mixers 722a, 722b, 722c, 722d, which may be similar to second mixers 622a, 622b, 622c, 622d, include an amplifier 718a, 718b, 718c, 718d, which may be similar to amplifiers 418a, 418b, 418c of FIG. 4, to boost the HS signal before up conversion. In embodiments, the amplifiers 718a, 718b, 718c, 718d may be low noise amplifiers.

Figure 8:
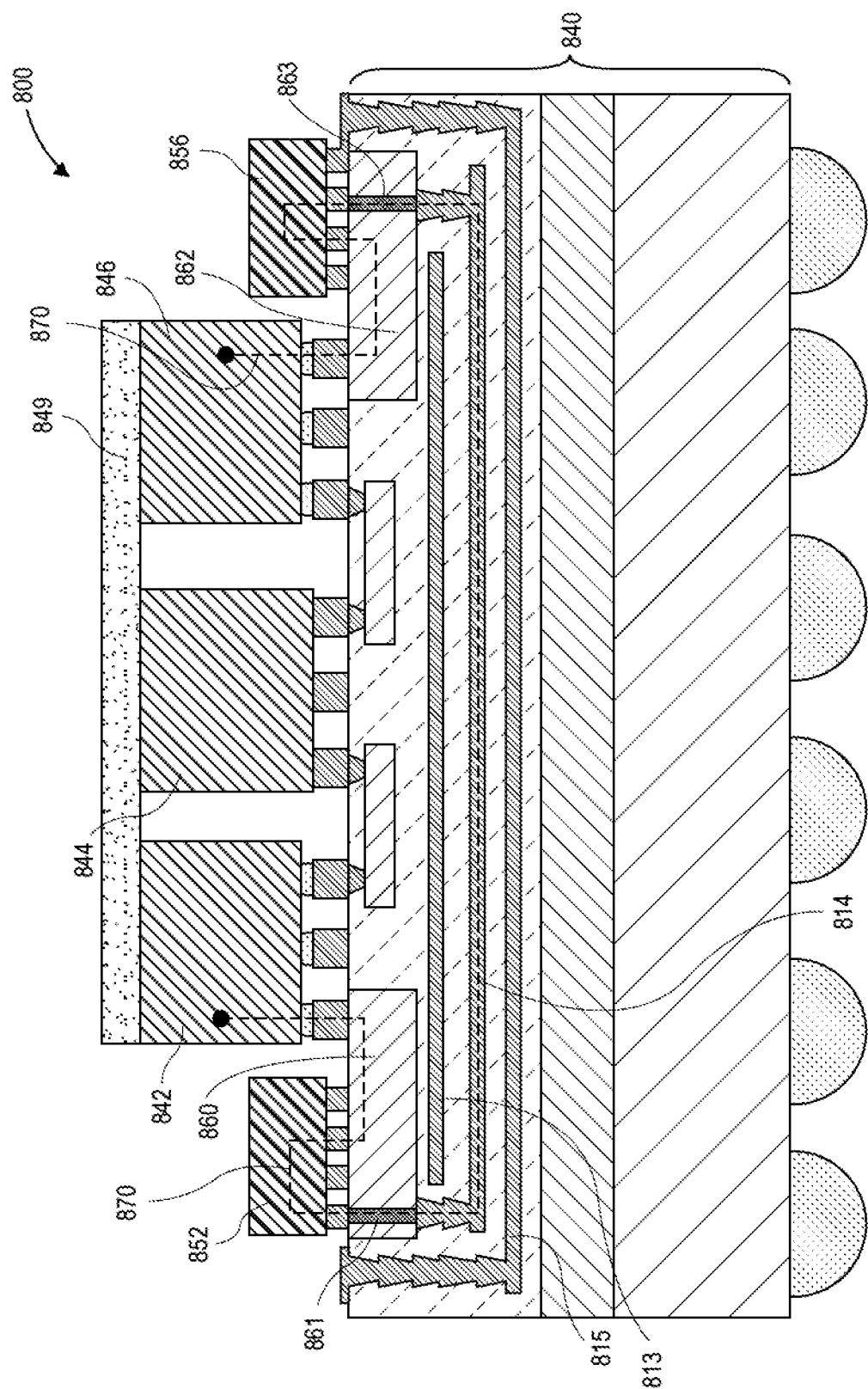
FIG. 8 illustrates a stacked die architecture with a transmission line embedded within a package substrate to communicate with remote dies on the package, in accordance with various embodiments.

FIG. 8 illustrates a stacked die architecture with a transmission line embedded within a package substrate to communicate with remote dies on the package, in accordance with various embodiments. Platform 800, which may be similar to platform 500 of FIG. 5, includes a first die 842, a second die 844, and a third die 846, that may be similar to first die 542, second die 544, third die 546 that are coupled to a package 840, which may be similar to package 540 of FIG. 5. An integrated heat spreader (IHS) 849 may be coupled to a top portion of the dies 842, 844, 846.

The first die 842 may be coupled, using an RF bridge 860 within the package 840, with a Tx Radio 852, which may be similar to first RF chip 552. The third die 846 may be electrically coupled, using an RF bridge 862 within the package 840, with a Rx Radio 856, which may be similar to third RF chip 556. The bridges 860, 862 may include EMIB, ZMV, ODI, or other bridges including high-speed bridges. The RF bridges 860, 862 may include, respectively, one or more first mixers, which may be similar to one or more mixers 602*a*, 602*b*, 602*c*, 602*d* of FIG. 6, to convert data received from the first die 842 into an IF signal which is then converted into an HS signal by combining a LO signal, as described with respect to FIG. 6. The HS signal may then be received by the Tx Radio 852, to then be transmitted through a conductive via 861 within the RF bridge 860 to a strip line 814, which may be similar to transmission line 514 of FIG. 5. The HS signal will then continue through a conductive via 863 through the RF bridge 862 to a Rx Radio 856, back through the RF bridge 862 and to the third die 846. This may be shown in conductive path 870, which may be similar to conductive path 570 of FIG. 5.

In embodiments, the strip line 814 may be shielded by a first ground plane 813 above the strip line 814, and a second ground plane 815 below the strip line 814. The HS signal will then be received by the Rx Radio 856, which will pass the received HS signal to the RF bridge 862 and a second mixer within the RF bridge 862 to convert the signal to an IF signal, and then to convert the IF signal into data that is then transmitted to the third die 846.

Figure 9:
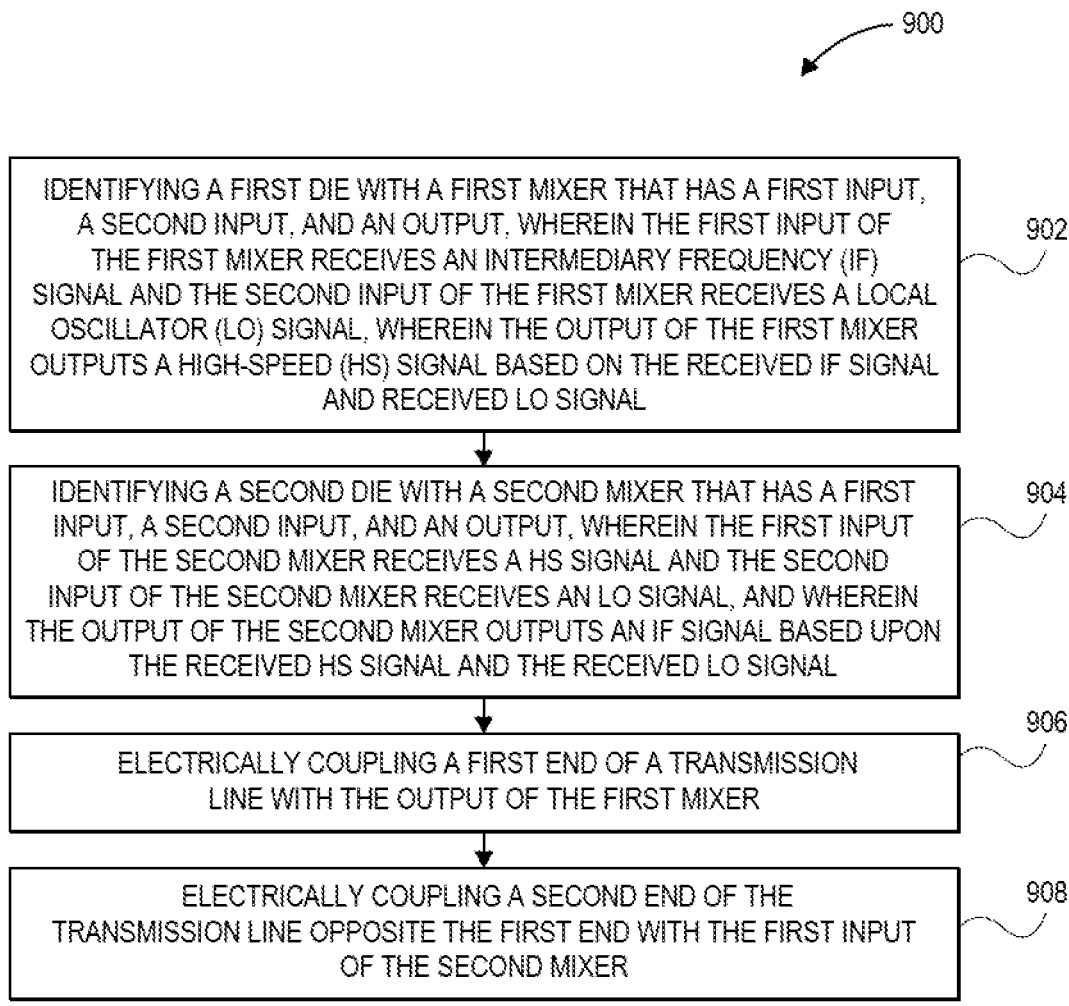
FIG. 9 illustrates an example of a process for creating a portion of a package that includes mixer to mixer communication over transmission line within the package without amplification, in accordance with various embodiments.

FIG. 9 illustrates an example of a process for creating a portion of a package that includes mixer to mixer communication over transmission line within the package without amplification, in accordance with various embodiments. This process may be performed using the techniques, methods, systems, and/or apparatus is described with respect to FIGS. 1-8.

At block 902, the process may include identifying a first die with a first mixer that has a first input, a second input, and an output, wherein the first input of the first mixer receives an intermediary frequency (IF) signal and the second input of the first mixer receives a local oscillator (LO) signal, wherein the output of the first mixer outputs a high-speed (HS) signal based on the received IF signal and received LO signal. In embodiments, the LO may be similar to LO 206 of FIG. 2, LO 406 of FIG. 4, and LOs 606, 606*a*, 606*b* of FIG. 6. The first mixer may be similar to first mixer 202 of FIG. 2, 402*a*, 402*b*, 402*c* of FIG. 4, and 602*a*, 602*b*, 602*c*, 602*d* of FIG. 6.

At block 904, the process may further include identifying a second die with a second mixer that has a first input, a second input, and an output, wherein the first input of the second mixer receives a HS signal and the second input of the second mixer receives an LO signal, and wherein the output of the second mixer outputs an IF signal based upon the received HS signal and the received LO signal. In embodiments, the second mixer may be similar to second mixer 222 of FIG. 2, 422*a*, 422*b*, 422*c* of FIG. 4, or 622*a*, 622*b*, 622*c*, 622*d* of FIG. 6.

At block 906, the process may further include directly electrically coupling a first end of a transmission line with the output of the first mixer. In embodiments, the first end of the transmission line may be similar to FLI 212 of FIG. 2, or 312 of FIG. 3, or as shown elsewhere herein. In embodiments, the transmission line may be similar to transmission line 214 of FIG. 2, 314 of FIG. 3, 414*a*, 414*b*, 414*c* of FIG. 4, 514 of FIG. 5, 614*a*, 614*b*, 614*c*, 614*d* of FIG. 6, or 814, 870 of FIG. 8, or as shown elsewhere herein.

At block 908, the process may include directly electrically coupling a second end of the transmission line opposite the first end with the first input of the second mixer. In embodiments, the second end of the transmission line may be similar to FLI 216 of FIG. 2, or 316 of FIG. 3, as shown elsewhere herein. In embodiments, the transmission line may be similar to transmission line 214 of FIG. 2, 314 of FIG. 3, 414*a*, 414*b*, 414*c* of FIG. 4, 514 of FIG. 5, 614*a*, 614*b*, 614*c*, 614*d* of FIG. 6, or 814, 870 of FIG. 8, or as shown elsewhere herein.

Figure 10:
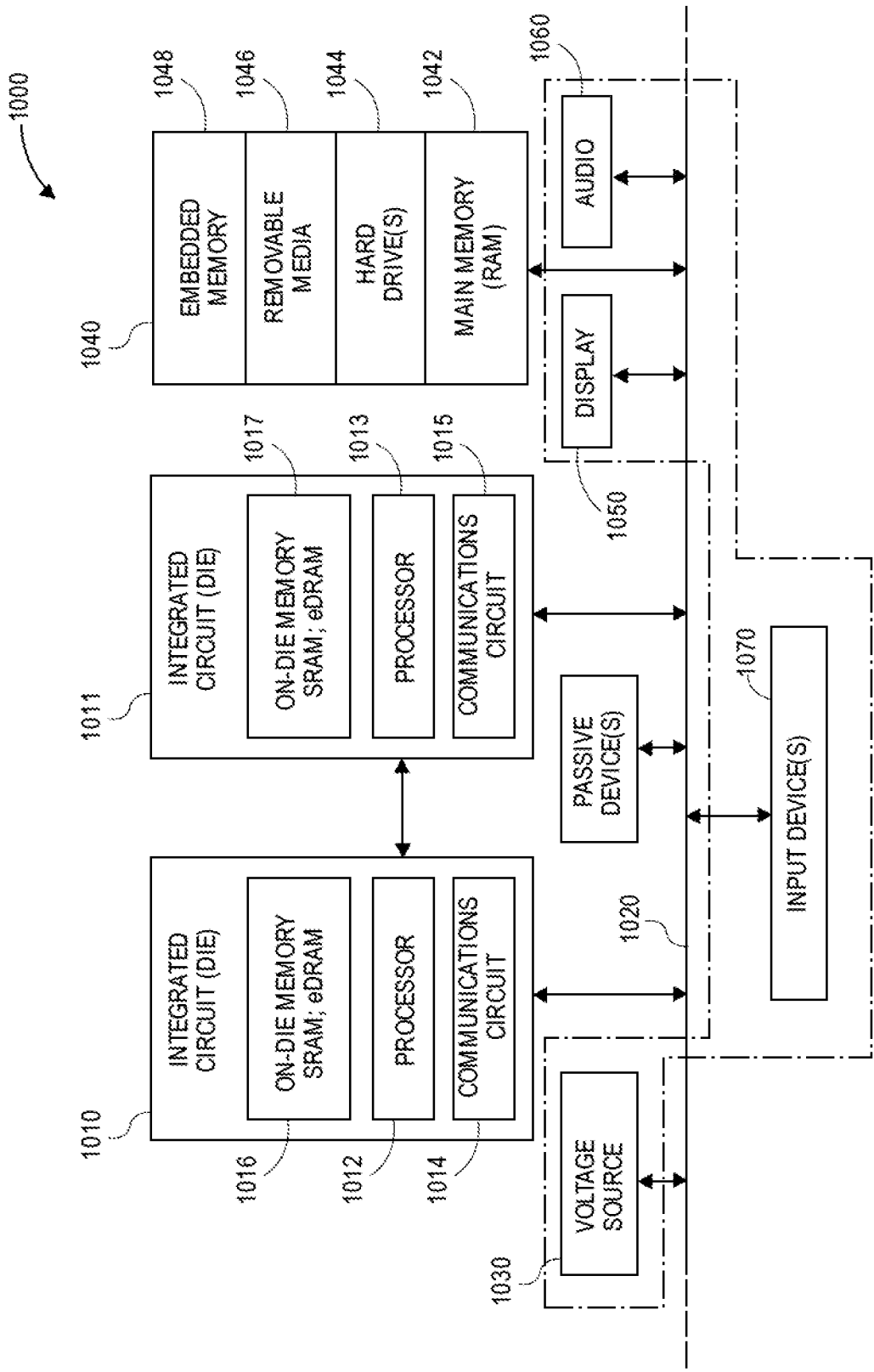
FIG. 10 schematically illustrates a computing device, in accordance with various embodiments.

FIG. 10 schematically illustrates a computing device, in accordance with various embodiments. FIG. 10 is a schematic of a computer system 1000, in accordance with an embodiment of the present invention. The computer system 1000 (also referred to as the electronic system 1000) as depicted can embody die to die high-speed communication without discrete amplifiers between a mixer and the transmission line, according to any of the several disclosed embodiments and their equivalents as set forth in this disclosure. The computer system 1000 may be a mobile device such as a netbook computer. The computer system 1000 may be a mobile device such as a wireless smart phone. The computer system 1000 may be a desktop computer. The computer system 1000 may be a hand-held reader. The computer system 1000 may be a server system. The computer system 1000 may be a supercomputer or high-performance computing system.

In an embodiment, the electronic system 1000 is a computer system that includes a system bus 1020 to electrically couple the various components of the electronic system 1000. The system bus 1020 is a single bus or any combination of busses according to various embodiments. The electronic system 1000 includes a voltage source 1030 that provides power to the integrated circuit 1010. In some embodiments, the voltage source 1030 supplies current to the integrated circuit 1010 through the system bus 1020.

The integrated circuit 1010 is electrically coupled to the system bus 1020 and includes any circuit, or combination of circuits according to an embodiment. In an embodiment, the integrated circuit 1010 includes a processor 1012 that can be of any type. As used herein, the processor 1012 may mean any type of circuit such as, but not limited to, a microprocessor, a microcontroller, a graphics processor, a digital signal processor, or another processor. In an embodiment, the processor 1012 includes, or is coupled with, die to die high-speed communication without discrete amplifiers between a mixer and the transmission line, as disclosed herein. In an embodiment, SRAM embodiments are found in memory caches of the processor. Other types of circuits that can be included in the integrated circuit 1010 are a custom circuit or an application-specific integrated circuit (ASIC), such as a communications circuit 1014 for use in wireless devices such as cellular telephones, smart phones, pagers, portable computers, two-way radios, and similar electronic systems, or a communications circuit for servers. In an embodiment, the integrated circuit 1010 includes on-die memory 1016 such as static random-access memory (SRAM). In an embodiment, the integrated circuit 1010 includes embedded on-die memory 1016 such as embedded dynamic random-access memory (eDRAM).

In an embodiment, the integrated circuit 1010 is complemented with a subsequent integrated circuit 1011. Useful embodiments include a dual processor 1013 and a dual communications circuit 1015 and dual on-die memory 1017 such as SRAM. In an embodiment, the dual integrated circuit 1010 includes embedded on-die memory 1017 such as eDRAM.

In an embodiment, the electronic system 1000 also includes an external memory 1040 that in turn may include one or more memory elements suitable to the particular application, such as a main memory 1042 in the form of RAM, one or more hard drives 1044, and/or one or more drives that handle removable media 1046, such as diskettes, compact disks (CDs), digital variable disks (DVDs), flash memory drives, and other removable media known in the art. The external memory 1040 may also be embedded memory 1048 such as the first die in a die stack, according to an embodiment.

In an embodiment, the electronic system 1000 also includes a display device 1050, an audio output 1060. In an embodiment, the electronic system 1000 includes an input device such as a controller 1070 that may be a keyboard, mouse, trackball, game controller, microphone, voice-recognition device, or any other input device that inputs information into the electronic system 1000. In an embodiment, an input device 1070 is a camera. In an embodiment, an input device 1070 is a digital sound recorder. In an embodiment, an input device 1070 is a camera and a digital sound recorder.

As shown herein, the integrated circuit 1010 can be implemented in a number of different embodiments, including a package substrate having die to die high-speed communication without discrete amplifiers between a mixer and the transmission line, according to any of the several disclosed embodiments and their equivalents, an electronic system, a computer system, one or more methods of fabricating an integrated circuit, and one or more methods of fabricating an electronic assembly that includes a package substrate having die to die high-speed communication without discrete amplifiers between a mixer and the transmission line, according to any of the several disclosed embodiments as set forth herein in the various embodiments and their art-recognized equivalents. The elements, materials, geometries, dimensions, and sequence of operations can all be varied to suit particular I/O coupling requirements including array contact count, array contact configuration for a microelectronic die embedded in a processor mounting substrate according to any of the several disclosed package substrates having die to die high-speed communication without discrete amplifiers between a mixer and the transmission line embodiments and their equivalents. A foundation substrate may be included, as represented by the dashed line of FIG. 10. Passive devices may also be included, as is also depicted in FIG. 10.

Various embodiments may include any suitable combination of the above-described embodiments including alternative (or) embodiments of embodiments that are described in conjunctive form (and) above (e.g., the "and" may be "and/or"). Furthermore, some embodiments may include one or more articles of manufacture (e.g., non-transitory computer-readable media) having instructions, stored thereon, that when executed result in actions of any of the above-described embodiments. Moreover, some embodiments may include apparatuses or systems having any suitable means for carrying out the various operations of the above-described embodiments.

The above description of illustrated embodiments, including what is described in the Abstract, is not intended to be exhaustive or to limit embodiments to the precise forms disclosed. While specific embodiments are described herein for illustrative purposes, various equivalent modifications are possible within the scope of the embodiments, as those skilled in the relevant art will recognize.

These modifications may be made to the embodiments in light of the above detailed description. The terms used in the following claims should not be construed to limit the embodiments to the specific implementations disclosed in the specification and the claims. Rather, the scope of the invention is to be determined entirely by the following claims, which are to be construed in accordance with established doctrines of claim interpretation.

The following paragraphs describe examples of various embodiments.

EXAMPLES

Example 1 is an apparatus comprising: a first die having a first mixer with a first input, a second input, and an output, wherein the first input of the first mixer receives an intermediary frequency (IF) signal and the second input of the first mixer receives a local oscillator (LO) signal, and wherein the output of the first mixer outputs a high-speed (HS) signal based on the received IF signal and received LO signal; a transmission line with a first end and a second end opposite the first end, the first end of the transmission line directly electrically coupled with the output of the first mixer; a second die having a second mixer with a first input, a second input, and an output, wherein the first input of the second mixer is directly electrically coupled with the second end of the transmission line and the second input of the second mixer receives the LO signal, and wherein the output of the second mixer outputs an IF signal based upon the received HS signal and the received LO signal; and wherein there are no discrete amplification components between the first mixer and the transmission line.

Example 2 includes the apparatus of example 1, wherein there are no discrete amplification components between the second mixer and the transmission line.

Example 3 includes the apparatus of example 1, wherein the first mixer is electrically coupled with the first end of the transmission line with one or more first level interconnects.

Example 4 includes the apparatus of example 3, wherein the one or more first level interconnects is a first one or more first level interconnects; and wherein the second mixer is electrically coupled with the second end of the transmission line with a second one or more first level interconnects.

Example 5 includes the apparatus of example 1, wherein the transmission line is a copper transmission line.

Example 6 includes the apparatus of example 1, wherein at least a portion of the transmission line is a strip line within a redistribution layer (RDL).

Example 7 includes the apparatus of example 6, wherein the at least the portion of the transmission line further includes a first ground plane proximate to but not electrically coupled with the transmission line on a first side of the transmission line, and a second ground plane proximate to but not electrically coupled with the transmission line on a second side of the transmission line, wherein the second side of the transmission line is opposite the first side of the transmission line.

Example 8 includes the apparatus of any one of examples 1-7, further comprising an amplifier disposed between the second end of the transmission line and the first input of the second mixer, the amplifier directly electrically coupled with the second end of the transmission line.

Example 9 includes the apparatus of example 1, wherein the received LO signal of the first mixer and the received LO signal of the second mixer are synchronized.

Example 10 is a method comprising: identifying a first die with a first mixer with a first input, a second input, and an output, wherein the first input of the first mixer receives an intermediary frequency (IF) signal and the second input of the first mixer receives a local oscillator (LO) signal, wherein the output of the first mixer outputs a high-speed (HS) signal based on the received IF signal and received LO signal; identifying a second die with a second mixer with a first input, a second input, and an output, wherein the first input of the second mixer receives a HS signal and the second input of the second mixer receives an LO signal, and wherein the output of the second mixer outputs an IF signal based upon the received HS signal and the received LO signal; electrically coupling a first end of a transmission line with the output of the first mixer; and electrically coupling a second end of the transmission line opposite the first end with the first input of the second mixer.

Example 11 includes the method of example 10, wherein there are no discrete amplification components between the first mixer and the transmission line.

Example 12 includes the method of example 10, further comprising electrically coupling a low noise amplifier between the second mixer and the transmission line.

Example 13 includes the method of any one of examples 10-12, wherein the transmission line is a copper transmission line.

Example 14 includes the method of example 14, further including forming the transmission line within a buildup layer of a package.

Example 15 is a system comprising: a first die including plurality of first mixers, each of the first mixers with a first input, a second input, and output, wherein the first input of each of the first mixers receives, respectively, an intermediary frequency (IAF) signal, and the second input of each of the first mixers receives, respectively, a local oscillator (LO) signal, and wherein the output of each of the first mixers outputs a high-speed (HS) signal based on, respectively, the received IF signal and the received LO signal; a plurality of transmission lines corresponding to each of the plurality of first mixers, each of the plurality of transmission lines with a first end and a second end opposite the first end, the first end of each of the transmission lines directly electrically coupled, respectively, with the output of each of the first mixers; a second die including plurality of second mixers, each of the second mixers with a first input, a second input, and an output, wherein the first input of each of the second mixers is directly electrically coupled, respectively, with the second end of each of the transmission lines, and wherein the second input of the plurality of second mixers are coupled, respectively, with a LO signal, and wherein the output of the plurality of second mixers includes an IF signal based, respectively, on the received HS signal and the received LO signal for each of the plurality of second mixers; and wherein there are no discrete amplification components between the first mixer and the transmission line.

Example 16 includes the system of example 15, further comprising a first XPU that includes a plurality of data ports, the plurality of data ports of the first XPU electrically coupled, respectively, with the plurality of first inputs of the first mixers.

Example 17 includes the system of example 16, further comprising a second XPU that includes a plurality of data ports, the plurality of data ports of the second XPU electrically coupled, respectively, with the plurality of outputs of the second mixers.

Example 18 includes the system of example 17, wherein there are no discrete amplification components between at least one of the second mixers and its corresponding transmission line.

Example 19 includes the system of any one of examples 15-18, wherein the plurality of transmission lines are conductive traces.

Example 20 includes the system of example 19, wherein the plurality of transmission lines are strip lines within a redistribution layer (RDL).

What is claimed is:

1. An apparatus comprising:
a first die having a first mixer with a first input, a second input, and an output, wherein the first input of the first mixer receives an intermediary frequency (IF) signal and the second input of the first mixer receives a local oscillator (LO) signal, and wherein the output of the first mixer outputs a high-speed (HS) signal based on the received IF signal and received LO signal;
a transmission line with a first end and a second end opposite the first end, the first end of the transmission line directly electrically coupled with the output of the first mixer;
a second die having a second mixer with a first input, a second input, and an output, wherein the first input of the second mixer is directly electrically coupled with the second end of the transmission line and the second input of the second mixer receives the LO signal, and wherein the output of the second mixer outputs an IF signal based upon the received HS signal and the received LO signal; and
wherein there are no discrete amplification components between the first mixer and the transmission line.

2. The apparatus of claim 1, wherein there are no discrete amplification components between the second mixer and the transmission line.

3. The apparatus of claim 1, wherein the first mixer is electrically coupled with the first end of the transmission line with one or more first level interconnects.

4. The apparatus of claim 3, wherein the one or more first level interconnects is a first one or more first level interconnects; and
wherein the second mixer is electrically coupled with the second end of the transmission line with a second one or more first level interconnects.

5. The apparatus of claim 1, wherein the transmission line is a copper transmission line.

6. The apparatus of claim 1, wherein at least a portion of the transmission line is a strip line within a redistribution layer (RDL).

7. The apparatus of claim 6, wherein the at least the portion of the transmission line further includes a first ground plane proximate to but not electrically coupled with the transmission line on a first side of the transmission line, and a second ground plane proximate to but not electrically coupled with the transmission line on a second side of the transmission line, wherein the second side of the transmission line is opposite the first side of the transmission line.

8. The apparatus of claim 1, further comprising an amplifier disposed between the second end of the transmission line and the first input of the second mixer, the amplifier directly electrically coupled with the second end of the transmission line.

9. The apparatus of claim 1, wherein the received LO signal of the first mixer and the received LO signal of the second mixer are synchronized.

10. A method comprising:
identifying a first die with a first mixer with a first input, a second input, and an output, wherein the first input of the first mixer receives an intermediary frequency (IF) signal and the second input of the first mixer receives a local oscillator (LO) signal, wherein the output of the first mixer outputs a high-speed (HS) signal based on the received IF signal and received LO signal;
identifying a second die with a second mixer with a first input, a second input, and an output, wherein the first input of the second mixer receives a HS signal and the second input of the second mixer receives an LO signal, and wherein the output of the second mixer outputs an IF signal based upon the received HS signal and the received LO signal;
electrically coupling a first end of a transmission line with the output of the first mixer; and
electrically coupling a second end of the transmission line opposite the first end with the first input of the second mixer.

11. The method of claim 10, wherein there are no discrete amplification components between the first mixer and the transmission line.

12. The method of claim 10, further comprising electrically coupling a low noise amplifier between the second mixer and the transmission line.

13. The method of claim 10, wherein the transmission line is a copper transmission line.

14. The method of claim 10, further including forming the transmission line within a buildup layer of a package.

15. A system comprising:
a first die including plurality of first mixers, each of the first mixers with a first input, a second input, and output, wherein the first input of each of the first mixers receives, respectively, an intermediary frequency (IAF) signal, and the second input of each of the first mixers receives, respectively, a local oscillator (LO) signal, and wherein the output of each of the first mixers outputs a high-speed (HS) signal based on, respectively, the received IF signal and the received LO signal;
a plurality of transmission lines corresponding to each of the plurality of first mixers, each of the plurality of transmission lines with a first end and a second end opposite the first end, the first end of each of the transmission lines directly electrically coupled, respectively, with the output of each of the first mixers;
a second die including plurality of second mixers, each of the second mixers with a first input, a second input, and an output, wherein the first input of each of the second mixers is directly electrically coupled, respectively, with the second end of each of the transmission lines, and wherein the second input of the plurality of second mixers are coupled, respectively, with a LO signal, and wherein the output of the plurality of second mixers includes an IF signal based, respectively, on the received HS signal and the received LO signal for each of the plurality of second mixers; and
wherein there are no discrete amplification components between the first mixer and the transmission line.

16. The system of claim 15, further comprising a first XPU that includes a plurality of data ports, the plurality of data ports of the first XPU electrically coupled, respectively, with the plurality of first inputs of the first mixers.

17. The system of claim 16, further comprising a second XPU that includes a plurality of data ports, the plurality of data ports of the second XPU electrically coupled, respectively, with the plurality of outputs of the second mixers.

18. The system of claim 17, wherein there are no discrete amplification components between at least one of the second mixers and its corresponding transmission line.

19. The system of claim 15, wherein the plurality of transmission lines are conductive traces.

20. The system of claim 19, wherein the plurality of transmission lines are strip lines within a redistribution layer (RDL).

* * * * *